US011112981B2

(12) United States Patent
Sung et al.

(10) Patent No.: US 11,112,981 B2
(45) Date of Patent: Sep. 7, 2021

(54) APPARATUS AND METHOD AND COMPUTER PROGRAM PRODUCT FOR CONFIGURING IMPEDANCE OF MEMORY INTERFACES

(71) Applicant: Silicon Motion, Inc., Zhubei (TW)

(72) Inventors: Wei-Liang Sung, Miaoli County (TW); Chi-Ping Chang, New Taipei (TW)

(73) Assignee: SILICON MOTION, INC., Zhubei (TW)

( * ) Notice: Subject to any disclaimer, the term of this patent is extended or adjusted under 35 U.S.C. 154(b) by 0 days.

(21) Appl. No.: 16/459,933

(22) Filed: Jul. 2, 2019

(65) Prior Publication Data
US 2020/0257462 A1  Aug. 13, 2020

Related U.S. Application Data

(60) Provisional application No. 62/804,999, filed on Feb. 13, 2019.

(30) Foreign Application Priority Data

Mar. 20, 2019 (CN) .......................... 201910211851.3

(51) Int. Cl.
*G06F 3/06* (2006.01)
*G11C 7/10* (2006.01)
*G11C 29/38* (2006.01)

(52) U.S. Cl.
CPC .......... *G06F 3/0632* (2013.01); *G06F 3/0614* (2013.01); *G06F 3/0673* (2013.01); *G11C 7/1048* (2013.01); *G11C 29/38* (2013.01)

(58) Field of Classification Search
CPC ...... G06F 12/00; G06F 3/0632; G06F 3/0614; G06F 3/0673; G11C 7/1048; G11C 29/38
USPC ........................................................ 711/104
See application file for complete search history.

(56) References Cited

U.S. PATENT DOCUMENTS

| 9,595,963 B2 | 3/2017 | McCall et al. | |
| 10,325,659 B1 * | 6/2019 | Tang | G11C 29/50008 |
| 2002/0166062 A1 * | 11/2002 | Helbig, Sr. | G06F 21/554 726/22 |

(Continued)

OTHER PUBLICATIONS

Taiwanese Office Action (with search report) dated Feb. 4, 2021 for Taiwanese Application No. 109113146.

*Primary Examiner* — Gautam Sain
(74) *Attorney, Agent, or Firm* — Birch, Stewart, Kolasch & Birch LLP

(57) ABSTRACT

The invention introduces a method for configuring impedance of memory interfaces, performed by a processing unit, including: setting a first impedance value associated with an on-die termination (ODT) for a receiver of a controller to a first default value; setting a second impedance value associated with a driver variable resistance for a transmitter of a memory device to a second default value; performing tests for test combinations each comprises a third impedance value associated with a driver variable resistance for a transmitter of the controller and a fourth impedance value associated with an ODT for a receiver of the memory device; and storing a test result for each in a predefined location of a static random access memory (SRAM), thereby enabling a calibration host to obtain the test result for each from the SRAM.

20 Claims, 9 Drawing Sheets

(56) References Cited

U.S. PATENT DOCUMENTS

| | | | |
|---|---|---|---|
| 2007/0070717 A1* | 3/2007 | Kim | G11C 29/02 |
| | | | 365/189.07 |
| 2017/0010984 A1* | 1/2017 | Berge | G06F 13/16 |
| 2018/0268918 A1* | 9/2018 | Glancy | G11C 7/00 |

* cited by examiner

| 0hm | Addr | Disabled 0h | RZQ/1 1h | RZQ/2 2h | RZQ/3 3h | RZQ/4 4h | RZQ/5 5h | RZQ/6 6h | RZQ/7 7h | 8h | 9h | Ah | Bh | Ch | Dh | Eh | Fh |
|---|---|---|---|---|---|---|---|---|---|---|---|---|---|---|---|---|---|
| 480 | 0h | 00 | 00 | 00 | 00 | 00 | 00 | 00 | 00 | 05 | 05 | 05 | 05 | 05 | 05 | 05 | 05 |
| 240 | 1h | 00 | 00 | 00 | 00 | 00 | 00 | 00 | 00 | 05 | 05 | 05 | 05 | 05 | 05 | 05 | 05 |
| 160 | 2h | 00 | 00 | 00 | 00 | 00 | 00 | 00 | 00 | 05 | 05 | 05 | 05 | 05 | 05 | 05 | 05 |
| 120 | 3h | 00 | 00 | 00 | 00 | 00 | 00 | 00 | 00 | 05 | 05 | 05 | 05 | 05 | 05 | 05 | 05 |
| 96 | 4h | 00 | 00 | 00 | 00 | 00 | 00 | 00 | 00 | 05 | 05 | 05 | 05 | 05 | 05 | 05 | 05 |
| 80 | 5h | 00 | 00 | 00 | 00 | 00 | 00 | 00 | 00 | 05 | 05 | 05 | 05 | 05 | 05 | 05 | 05 |
| 68.6 | 6h | 00 | 00 | 00 | 00 | 00 | 00 | 00 | 00 | 05 | 05 | 05 | 05 | 05 | 05 | 05 | 05 |
| 60 | 7h | 00 | 00 | 00 | 00 | 00 | 00 | 00 | 00 | 05 | 05 | 05 | 05 | 05 | 05 | 05 | 05 |
| 53.3 | 8h | 00 | 00 | 00 | 00 | 00 | 00 | 00 | 00 | 05 | 05 | 05 | 05 | 05 | 05 | 05 | 05 |
| 48 | 9h | 00 | 00 | 00 | 00 | 00 | 00 | 00 | 00 | 05 | 05 | 05 | 05 | 05 | 05 | 05 | 05 |
| 43.6 | Ah | 00 | 00 | 00 | 00 | 00 | 00 | 00 | 00 | 05 | 05 | 05 | 05 | 05 | 05 | 05 | 05 |
| 40 | Bh | 00 | 00 | 00 | 00 | 00 | 00 | 00 | 00 | 05 | 05 | 05 | 05 | 05 | 05 | 05 | 05 |
| 36.9 | Ch | 00 | 00 | 00 | 00 | 00 | 00 | 00 | 00 | 05 | 05 | 05 | 05 | 05 | 05 | 05 | 05 |
| 34.3 | Dh | 00 | 00 | 00 | 00 | 00 | 00 | 00 | 00 | 05 | 05 | 05 | 05 | 05 | 05 | 05 | 05 |
| 32 | Eh | 00 | 00 | 00 | 00 | 00 | 00 | 00 | 00 | 05 | 05 | 05 | 05 | 05 | 05 | 05 | 05 |
| 30 | Fh | 00 | 00 | 00 | 00 | 00 | 00 | 00 | 00 | 05 | 05 | 05 | 05 | 05 | 05 | 05 | 05 |

Weak → Strong: Signal strengths related to ODT of DRAM-side

Weak → Strong: Signal strengths related to driver of ASIC-side

FIG. 5

| Ohm | | | Addr | 0h | 1h | 2h | 3h | 4h | 5h | 6h | 7h | 8h | 9h | Ah | Bh | Ch | Dh | Eh | Fh |
|---|---|---|---|---|---|---|---|---|---|---|---|---|---|---|---|---|---|---|---|
| | RZQ/5 | RZQ/7 | | | | | | | | | | | | | | | | | |
| | 0h | 1h | 0h | 00 | 00 | 05 | 05 | 05 | 05 | 05 | 05 | 05 | 05 | 05 | 05 | 05 | 05 | 05 | 05 |
| 120 | | | 1h | 00 | 00 | 05 | 05 | 05 | 05 | 05 | 05 | 05 | 05 | 05 | 05 | 05 | 05 | 05 | 05 |
| | | | 2h | 00 | 00 | 05 | 05 | 05 | 05 | 05 | 05 | 05 | 05 | 05 | 05 | 05 | 05 | 05 | 05 |
| | | | 3h | 00 | 00 | 05 | 05 | 05 | 05 | 05 | 05 | 05 | 05 | 05 | 05 | 05 | 05 | 05 | 05 |
| | | | 4h | 00 | 00 | 05 | 05 | 05 | 05 | 05 | 05 | 05 | 05 | 05 | 05 | 05 | 05 | 05 | 05 |
| 60 | | | 5h | 00 | 00 | 05 | 05 | 05 | 05 | 05 | 05 | 05 | 05 | 05 | 05 | 05 | 05 | 05 | 05 |
| | | | 6h | 00 | 00 | 05 | 05 | 05 | 05 | 05 | 05 | 05 | 05 | 05 | 05 | 05 | 05 | 05 | 05 |
| | | | 7h | 00 | 00 | 05 | 05 | 05 | 05 | 05 | 05 | 05 | 05 | 05 | 05 | 05 | 05 | 05 | 05 |
| | | | 8h | 00 | 00 | 05 | 05 | 05 | 05 | 05 | 05 | 05 | 05 | 05 | 05 | 05 | 05 | 05 | 05 |
| 40 | | | 9h | 00 | 00 | 05 | 05 | 05 | 05 | 05 | 05 | 05 | 05 | 05 | 05 | 05 | 05 | 05 | 05 |
| | | | Ah | 00 | 00 | 05 | 05 | 05 | 05 | 05 | 05 | 05 | 05 | 05 | 05 | 05 | 05 | 05 | 05 |
| | | | Bh | 00 | 00 | 05 | 05 | 05 | 05 | 05 | 05 | 05 | 05 | 05 | 05 | 05 | 05 | 05 | 05 |
| | | | Ch | 00 | 00 | 05 | 05 | 05 | 05 | 05 | 05 | 05 | 05 | 05 | 05 | 05 | 05 | 05 | 05 |
| | | | Dh | 00 | 00 | 05 | 05 | 05 | 05 | 05 | 05 | 05 | 05 | 05 | 05 | 05 | 05 | 05 | 05 |
| | | | Eh | 00 | 00 | 05 | 05 | 05 | 05 | 05 | 05 | 05 | 05 | 05 | 05 | 05 | 05 | 05 | 05 |
| | | | Fh | 00 | 00 | 05 | 05 | 05 | 05 | 05 | 05 | 05 | 05 | 05 | 05 | 05 | 05 | 05 | 05 |

FIG. 6

APPARATUS AND METHOD AND COMPUTER PROGRAM PRODUCT FOR CONFIGURING IMPEDANCE OF MEMORY INTERFACES

CROSS-REFERENCE TO RELATED APPLICATIONS

This application claims the benefit of priority to U.S. Provisional Application Ser. No. 62/804,999, filed on Feb. 13, 2019; and Patent Application No. 201910211851.3, filed in China on Mar. 20, 2019; the entirety of which is incorporated herein by reference for all purposes.

BACKGROUND

The disclosure generally relates to communications interface and, more particularly, to methods and computer program products for configuring impedance of a memory interface.

After the Dynamic Random Access Memory (DRAM) bus speed reaches a high data rate, for example 500 Mb/s or higher, signaling problems may occur at the system level design. For example, reflections may be generated from the stub lines that connect to the peer device, such as a controller, a DRAM module, etc. A driver and on-die termination (ODT) are required to be calibrated to solve the signaling problems. Thus, it is desirable to have apparatuses, methods and computer program products for configuring impedance of the driver and the ODT of memory interfaces.

SUMMARY

In an aspect of the invention, a method for configuring impedance of memory interfaces, performed by a processing unit, in introduced to comprise: setting a first impedance value associated with an on-die termination (ODT) for a receiver of a controller to a first default value; setting a second impedance value associated with a driver variable resistance for a transmitter of a memory device to a second default value; performing tests for test combinations each comprises a third impedance value associated with a driver variable resistance for a transmitter of the controller and a fourth impedance value associated with an ODT for a receiver of the memory device; and storing a test result for each in a predefined location of a static random access memory (SRAM), thereby enabling a calibration host to obtain the test result for each from the SRAM.

In another aspect of the invention, a non-transitory computer program product for configuring impedance of memory interfaces is introduce to comprise program code. The program code when been loaded and executed by a processing unit performs the above method.

In another aspect of the invention, an apparatus for configuring impedance of memory interfaces is introduce to comprise a controller. A processing unit of the controller when loading and executing program codes of a software or firmware module performs the above method.

Both the foregoing general description and the following detailed description are examples and explanatory only, and are not restrictive of the invention as claimed.

BRIEF DESCRIPTION OF THE DRAWINGS

FIG. 5 is a schematic diagram of an initial data table of write trainings for Double Data Rate 4 (DDR4) Dynamic Random Access Memory (DRAM) according to an embodiment of the invention.

FIG. 6 is a schematic diagram of an initial data table of read trainings for DDR4 DRAM according to an embodiment of the invention.

DETAILED DESCRIPTION

Reference is made in detail to embodiments of the invention, which are illustrated in the accompanying drawings. The same reference numbers may be used throughout the drawings to refer to the same or like parts, components, or operations.

The present invention will be described with respect to particular embodiments and with reference to certain drawings, but the invention is not limited thereto and is only limited by the claims. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent." etc.)

Figure 1:
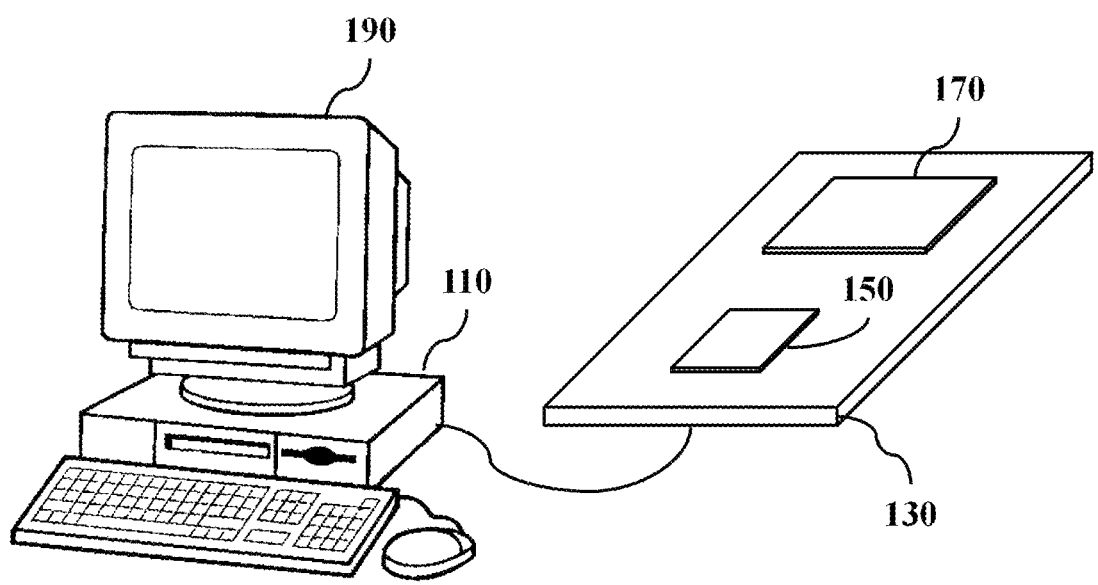
FIG. 1 is a schematic diagram of a calibration system according to an embodiment of the invention.

Refer to FIG. 1. A controller 150 and a memory device 170 may be mounted on a substrate 130 and the controller 150 is coupled or connected to the memory device 170 via the substrate 130. The memory device 170 may be a Dynamic Random Access Memory (DRAM), or others. A calibration host 110, being coupled to the controller 150, issues a command to request the controller 150 to perform an impedance test method and in turn reads test results from the controller 150, so as to display the test results on a displayer 190. Therefore, an engineer may determine impedance configurations of interfaces of the controller 150 and the memory device 170. Or, in alternative embodiments, the calibration host 110 may execute an application to parse and interpret the test results and automatically determine impedance settings of interfaces of the controller 150 and the memory device 170 accordingly based on an algorithm. Subsequently, the calibration host 110 may issue a command with the determined impedance settings to request the controller 150 to perform a method for configuring impedance of a memory interface. A processing unit 210 of the controller 150 when loading and executing relevant firmware or software program codes of the method for configuring impedance of the memory interface programs the determined impedance settings into non-volatile storage space of the controller 150 and the memory device 170 as factory settings.

Figure 2:
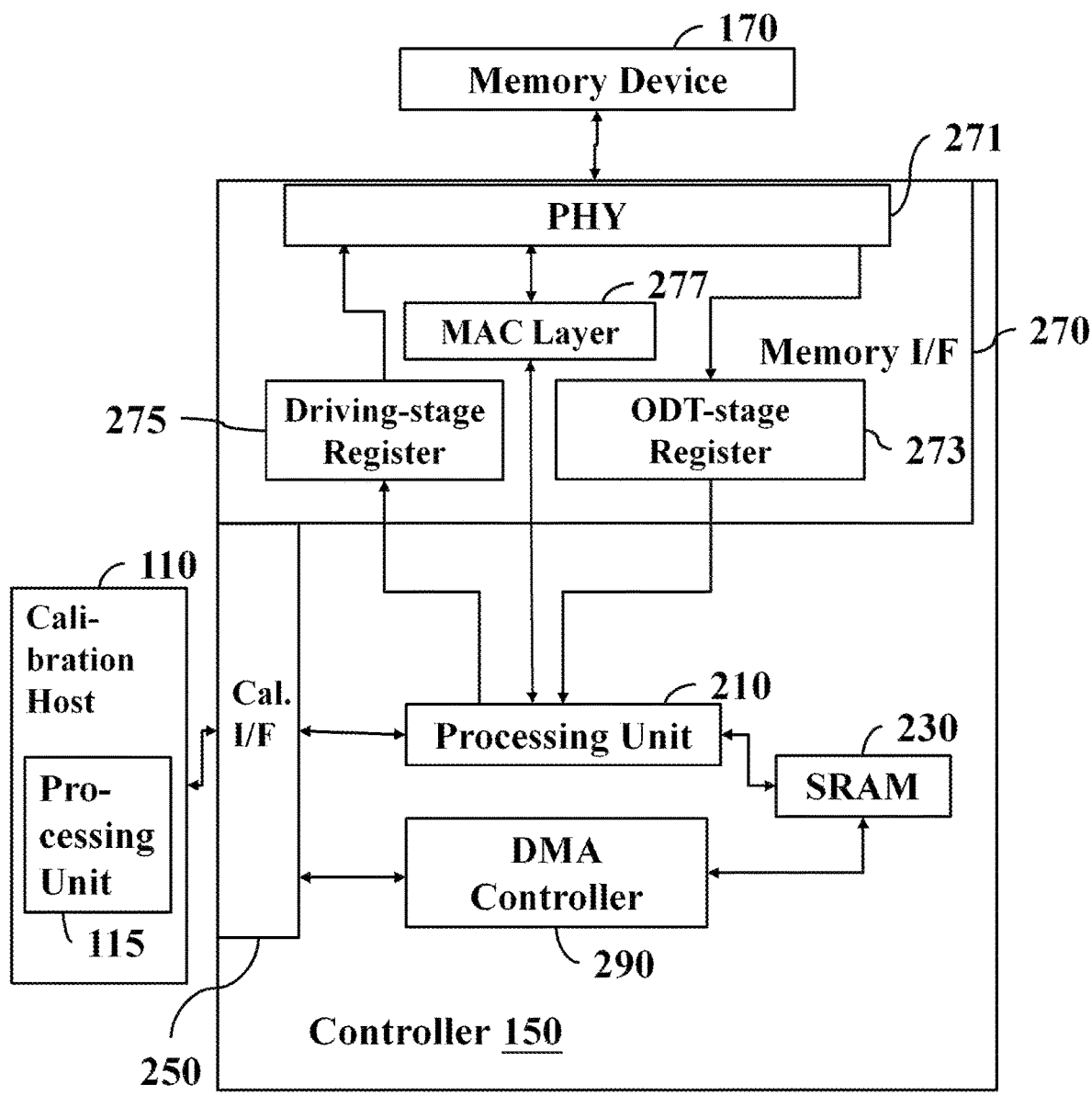
FIG. 2 is a block diagram of a calibration system according to an embodiment of the invention.

Refer to FIG. 2. The controller 150 may include the processing unit 210 that may be implemented in numerous ways, such as with general-purpose hardware (e.g., a single processor, multiple processors or graphics processing units capable of parallel computations, or others) that is programmed using firmware or software instructions of Mass Production Integrated System Program (MPISP) to perform the functions recited herein. The controller 150 may include a calibration interface (I/F) 250, such as I2C interface, that permits the calibration host 110 to issue commands therethrough to the processing unit 210 for activating executions of the methods for impedance tests and configurations for the memory interface. After the calibrations have been performed completely, the calibration host 110 may request a Direct Memory Access (DMA) controller 290 through the calibration I/F 250 to read test results from a predefined region of a Static Random Access Memory (SRAM) 230. The MPISP may be stored in a Read Only Memory (ROM, not shown in FIG. 2) of the controller 150 before left from a factory, or transmitted from the calibration host 110 to the controller 150 through the calibration I/F 250 or others before a start of calibrations.

In some embodiments, the controller 170 may be refer to as an Application-Specific Integrated Circuit (ASIC)-side and the memory device 170 may be a DRAM that is referred to as a DRAM-side for buffering data, such as variables, data tables, a wide range of user data, etc. that is required in executions of software and firmware instructions. The memory I/F 270 may communicate with the DRAM using a Double Data Rate (DDR) protocol, such as DDR3, Low Power DDR3 (LPDDR3), DDR4, etc. The I/O signals between the memory I/F 270 and the DRAM may include reset, CK, CK_N, CKE, ODT, CS_N, ACT_N, BG, BA, A, DM, DQS, DQS_N, DQ_lower, DQ_upper, and so on.

The memory interface 470 may include a Physical layer (PHY) 471 composed of circuits for connecting to the memory device 370. The DDR protocol with associated PHY 471 may provide communications capabilities for sending commands, addresses, data and others to the memory device 370 and receiving data, addresses, messages and others from the memory device 370. The PHY 471 includes a transmitter for sending signals to a receiver of the memory device 370 and a receiver for receiving signals from a transmitter of the memory device 370. A variable resistance may be added at the output of the transmitter (also referred to as a driver) of the PHY 471, thereby enabling the processing unit 210 to alter the impedance value of the driver variable resistance by changing the setting of the driving-stage register 275, leading to a change of an output driving strength. On the other hand, a variable resistance (may be referred to as an ODT variable resistance) may be added at the input of the receiver of the PHY 471, thereby enabling the processing unit 210 to alter the impedance value of the ODT variable resistance by changing the setting of the ODT-stage register 273.

The driving-stage register 275 may store a 4-Bit value as shown in Table 1:

TABLE 1

| Value (Decimal) | Z Target (ohm) |
|---|---|
| 0 | 480 |
| 1 | 240 |
| 2 | 160 |
| 3 | 120 |
| 4 | 96 |
| 5 | 80 |
| 6 | 68.6 |
| 7 | 60 |
| 8 | 53.3 |
| 9 | 48 |
| 10 | 43.6 |
| 11 | 40 |
| 12 | 36.9 |
| 13 | 34.3 |
| 14 | 32 |
| 15 | 30 |

For example, when the value stored in the driving-stage register 275 is set to 0, the impedance value of the driver variable resistance is adjusted to 480 ohm. When the value stored in the driving-stage register 275 is set to 1, the impedance value of the driver variable resistance is adjusted to 240 ohm. The remaining adjustments to the impedance value of the driver variable resistance in response to changes of the values stored in the driving-stage register 275 can be deduced by analogy and omitted herein for brevity.

The ODT-stage register 273 may store a 4-Bit value as shown in Table 2:

TABLE 2

| Value (Decimal) | Z Target (ohm) |
|---|---|
| 2 | 120 |
| 5 | 60 |
| 8 | 40 |

For example, when the value stored in the ODT-stage register 273 is set to 2, the impedance value of the ODT variable resistance is adjusted to 120 ohm. The remaining adjustments to the impedance value of the ODT variable resistance in response to changes of the values stored in the ODT-stage register 273 can be deduced by analogy and omitted herein for brevity.

On the other hand, the memory device 170 may be equipped with similar variable resistances for altering an output driving strength and an ODT impedance. The processing unit 210 may instruct a Media Access Control (MAC) layer 277 to issue commands to the memory device 170 through the PHY 271 for altering the output driving strength for the transmitter of the memory device 170 and the ODT impedance for the receiver of the memory device 170.

When the memory interface 470 uses DDR3 protocol to communicate with the memory device 170, the processing unit 210 may instruct the MAC layer 277 to issue I/O Configuration Command with a setting value to the memory device 170 through the PHY 271. The memory interface 470 may instruct the memory device 170 through A5 and A1 signals to adjust the impedance value of the driver variable resistance thereof to a specific level as shown in Table 3:

TABLE 3

| A5 | A1 | Output driver impedance value |
|----|----|-------------------------------|
| 0  | 0  | RZQ/6                         |
| 0  | 1  | RZQ/7                         |
| 1  | 0  | Reserved                      |
| 1  | 1  | Reserved                      |

Those artisans realize that RZQ represents 240 ohm. For example, when both A5 and A1 signals are 0s, the memory device 170 adjusts the impedance value of the driver variable resistance thereof to 40 ohm (i.e. RZQ/6). When A5 and A1 signals are 1 and 0, respectively (i.e. a reserved value), the memory device 170 may not alter the impedance value of the driver variable resistance thereof. The remaining adjustments to the impedance value of the driver variable resistance of the memory device 170 in response to changes of the settings with the issued command can be deduced by analogy and omitted herein for brevity. In addition, the memory interface 470 may instruct the memory device 170 through A9, A6 and A2 signals to adjust the impedance value of the ODT variable resistance thereof to a specific level as shown in Table 4:

TABLE 4

| A9 | A6 | A2 | Rtt_Nom  |
|----|----|----|----------|
| 0  | 0  | 0  | Disabled |
| 0  | 0  | 1  | RZQ/4    |
| 0  | 1  | 0  | RZQ/2    |
| 0  | 1  | 1  | RZQ/6    |
| 1  | 0  | 0  | RZQ/12   |
| 1  | 0  | 1  | RZQ/8    |
| 1  | 1  | 0  | Reserved |
| 1  | 1  | 1  | Reserved |

For example, when A9, A6 and A2 signals are all 0s, the memory device 170 may disable ODT thereof. When A9, A6 and A2 signals are 0, 0 and 1, respectively, the memory device 170 may adjust the impedance value of the ODT variable resistance thereof to 60 ohm (i.e. RZQ/4). When A9, A6 and A2 signals are 1, 1 and 0, respectively (i.e. a reserved value), the memory device 170 may not alter the impedance value of the ODT variable resistance thereof. The remaining adjustments to the impedance value of the ODT variable resistance of the memory device 170 in response to changes of the settings with the issued command can be deduced by analogy and omitted herein for brevity.

When the memory interface 470 uses DDR4 protocol to communicate with the memory device 170, the processing unit 210 may instruct the MAC layer 277 to issue I/O Configuration Command with a setting value to the memory device 170 through the PHY 271. The memory interface 470 may instruct the memory device 170 through A5 and A1 signals to adjust the impedance value of the driver variable resistance thereof to a specific level as shown in Table 5:

TABLE 5

| A5 | A1 | Output driver impedance value |
|----|----|-------------------------------|
| 0  | 0  | RZQ/7                         |
| 0  | 1  | RZQ/5                         |
| 1  | 0  | Reserved (or RZQ/6)           |
| 1  | 1  | Reserved                      |

Details for altering impedance values of driver variable resistance described in Table 5 may refer to the above descriptions of Table 3 and are omitted for brevity. In addition, the memory interface 470 may instruct the memory device 170 through A9, A6 and A2 signals to adjust the impedance value of the ODT variable resistance thereof to a specific level as shown in Table 6:

TABLE 6

| A9 | A6 | A2 | ODT Impedance Value |
|----|----|----|---------------------|
| 0  | 0  | 0  | Disabled            |
| 0  | 0  | 1  | RZQ/4               |
| 0  | 1  | 0  | RZQ/2               |
| 0  | 1  | 1  | RZQ/6               |
| 1  | 0  | 0  | RZQ/1               |
| 1  | 0  | 1  | RZQ/5               |
| 1  | 1  | 0  | RZQ/3               |
| 1  | 1  | 1  | RZQ/7               |

Details for altering impedance values of ODT variable resistance described in Table 6 may refer to the above descriptions of Table 4 and are omitted for brevity.

When the memory interface 470 uses LPDDR3 protocol to communicate with the memory device 170, the processing unit 210 may instruct the MAC layer 277 to issue Mode Register Write Command with a setting value to the memory device 170 through the PHY 271. The memory interface 470 may instruct the memory device 170 to perform an I/O Configuration by writing "03H" into MA[7:0] of a mode register, and instruct the memory device 170 to adjust the impedance value of the driver variable resistance thereof to a specific level by writing a value into OP<3:0> of the mode register, as shown in Table 7:

TABLE 7

| Op<3:0>    | Output Driver Impedance Value |
|------------|-------------------------------|
| 0000       | Reserved                      |
| 0001       | 34.3 ohm typical              |
| 0010       | 40 ohm typical (default)      |
| 0011       | 48 ohm typical                |
| 0100       | 60 ohm typical                |
| 0110       | 80 ohm typical                |
| 1001       | 34.3 ohm pull-down, 40 ohm pull-up (240 ohm termination) |
| 1010       | 40 ohm pull-down, 48 ohm pull-up (240 ohm termination) |
| 1011       | 34.3 ohm pull-down, 48 ohm pull-up (120 ohm termination) |
| All others | Reserved                      |

For example, when "0010" (default value) is written into OP<3:0> of the mode register, the memory device 170 adjusts the impedance value of the driver variable resistance thereof to 34.3 ohm (i.e. RZQ/6). When "1001" is written into OP<3:0> of the mode register, the memory device 170 adjusts the pull-down, pull-up and termination impedance values of the driver variable resistance thereof to 34.3, 40 and 240 ohms, respectively. When "0000" (i.e. a reserved value) or any other unlisted in Table 7 is written into OP<3:0> of the mode register, the memory device 170 may not alter the impedance value of the driver variable resistance thereof. The remaining adjustments to the impedance value of the driver variable resistance of the memory device 170 in response to changes of OP<3:0> of the mode register can be deduced by analogy and omitted herein for brevity.

Additionally, the memory interface 470 may instruct the memory device 170 to perform an ODT control by writing "0BH" into MA[7:0] of the mode register, and instruct the memory device 170 to adjust the impedance value of the ODT variable resistance thereof to a specific level by writing a value into OP<1:0> of the mode register, as shown in Table 8:

TABLE 8

| Op<1:0> | ODT Impedance Value |
| --- | --- |
| 00 | Disabled (default) |
| 01 | Reserved |
| 10 | RZQ/2 |
| 11 | RZQ/1 |

For example, when "00" (default value) is written into OP<1:0> of the mode register, the memory device 170 may disable its ODT. When "01" (i.e. a reserved value) is written into OP<1:0> of the mode register, the memory device 170 may not alter the impedance value of the ODT variable resistance thereof. When "10" is written into OP<1:0> of the mode register, the memory device 170 adjusts the impedance value of the ODT variable resistance thereof to 120 ohm (i.e. RZQ/2). The remaining adjustments to the impedance value of the ODT variable resistance of the memory device 170 in response to changes of OP<1:0> of the mode register can be deduced by analogy and omitted herein for brevity.

Figure 3:
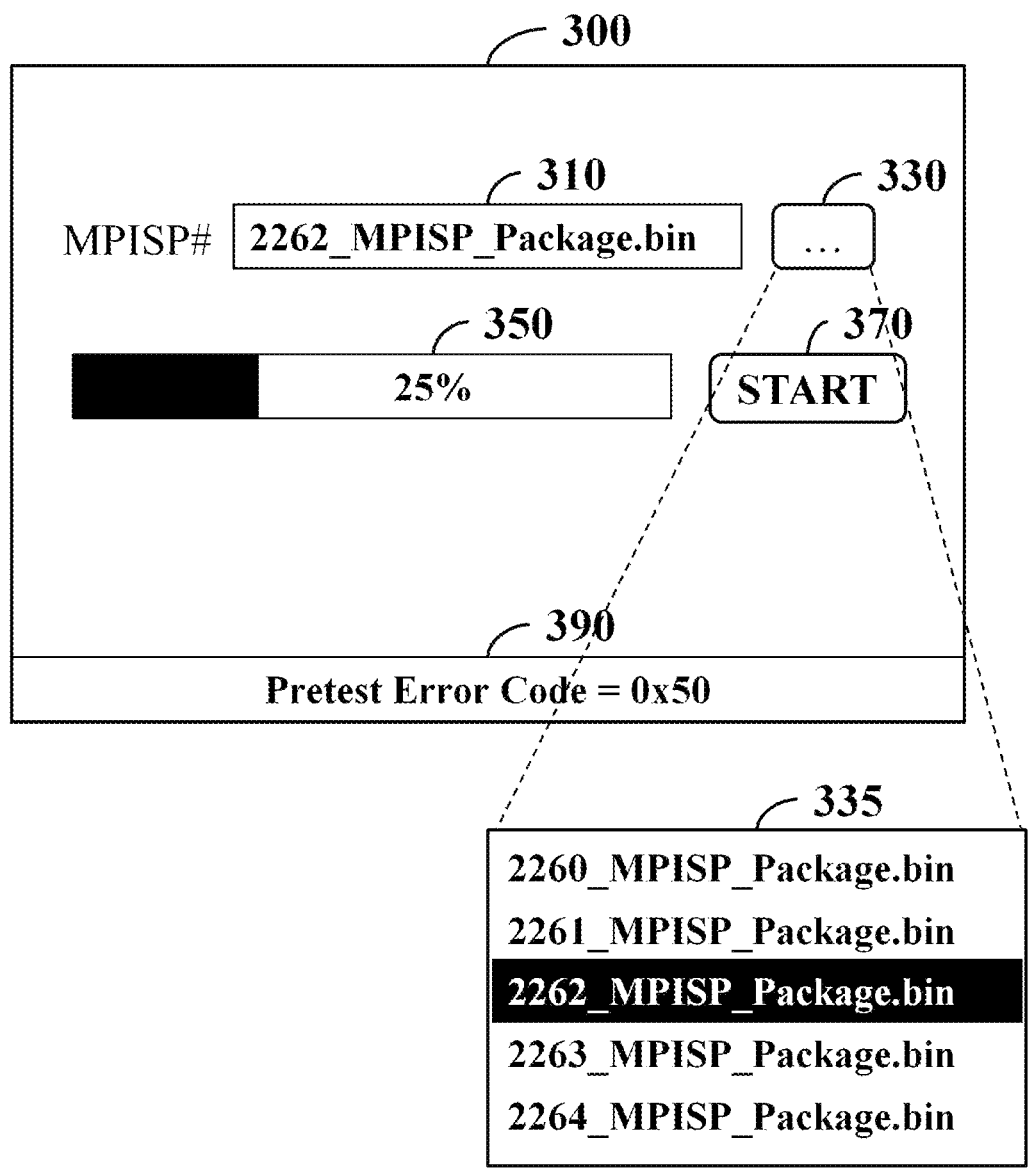
FIG. 3 is a Graphical User Interface (GUI) for configuring impedance of a memory interface according to an embodiment of the invention.

The processing unit 115 of the calibration host 110 may execute a calibration tool providing a Man-Machine Interface (MMI) to facilitate impedance configurations of a memory interface by an engineer. The displayer 190 displays a calibration Graphical User Interface (GUI) 300 as shown in FIG. 3 for calibrating a memory. The calibration GUI 300 may provide a selection button 330. When the selection button 330 is clicked by a user, the processing unit 115 may execute On_click( ) event handler of the selection button 330 to display a selection menu 335 including items on the displayer 190, in which each item is associated with one MPISP stored in the ROM of the controller 150, such as DRAM MPISP. A display box 310 may display the determined MPISP reflecting a manipulation to the selection menu 335 by a user. The calibration GUI 300 may further provide a start button 370. When the start button 330 is clicked by a user, the processing unit 115 may execute On_click( ) event handler of the start button 330 to instruct the processing unit 210 of the controller 115 through the calibration interface 250 to load and execute the determined MPISP. The calibration host 110 may continuously obtain test results for transmitters and receivers of the memory interface 270 and the memory device 170 through the calibration interface 250 and the DMA controller 290 and modify the content of the test progress box 350 and the calibration message box 390 accordingly.

Figure 4:
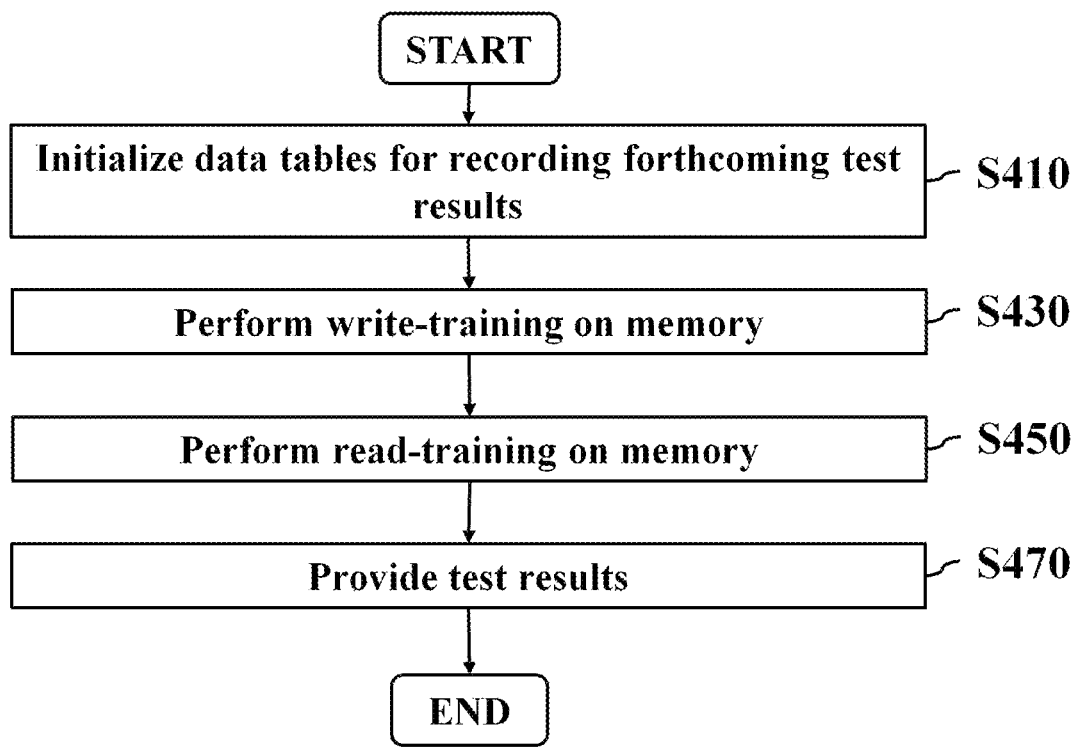
FIG. 4 is a flowchart illustrating a method for training a transmitter and a receiver of a memory interface according to an embodiment of the invention.

The processing unit 210 when loading and executing the designated MPISP may realize the process flow illustrated in FIG. 4. After the memory device 170 is initiated, the processing unit 210 may execute instructions of the function vInitDramZQRemapIdx( ) to initialize data tables storing test results (step S410). Next, the processing unit 210 may execute instructions of the function vScanDramWindow (WrTraining) to perform a write-training on a memory (step S430) and execute instructions of the function vScanDramWindow(RdTraining) to perform a read-training on the memory (step S450). Although the embodiments describe carrying different input parameters "WrTraining" and "RdTraining" into program codes of the single function to activate the write-training and the read-training on the memory, respectively, those artisans may alternatively implement the read-training and the write-training on the memory in different function. In alternative embodiments, the processing unit 210 may execute the memory read-training followed by the memory write-training. In alternative embodiments, the processing unit 210 may not execute the memory read-training and set default values (for example, medium stages) for the ODT with the receiver of the controller 150 and the impedance of the driver variable resistance with the transmitter of the memory device 170, respectively, for memory reads. Lastly, test results are provided in the SRAM 230 (step S470).

In step S410, the processing unit 210 may initiate different data tables for recording the forthcoming test results of the write-training and the read-training, respectively. Takes DRAM as an example: A write-training data table includes two axes: one axis being associated with signal strengths related to the DRAM-side ODT sorted from the strongest to the weakest or from the weakest to the strongest; and the other being associated with signal strengths related to the ASIC-side driver sorted from the strongest to the weakest or from the weakest to the strongest. The purpose of the write-training is to seek a proper impedance match between the driver variable resistance of the ASIC-side and the ODT of the DRAM-side. The purpose of the read-training is to seek a proper impedance match between the driver variable resistance of the DRAM-side and the ODT of the ASIC-side. The above remapping according to signal strengths may facilitate a interpretation by an engineer or an application algorithm, leading to an efficient search to find out proper stages among various combinations of impedance values of the ASIC-side and the DRAM-side. The initiated data tables may be stored in the SRAM 230.

Takes DDR4 DRAM as examples: Refer to FIG. 5. To make the interpretation easier by an engineer or application, the write-training data table may be formatted by 16×16 bytes and each byte records a test result when the driver variable resistance of the ASIC-side is set to a first impedance value and the ODT of the DRAM-side is set to a second impedance value. Cells of the data table may be conceptually segmented into groups of 16 bytes. For example, when the driver variable resistance of the ASIC-side is fixed to a specific impedance value (e.g. 480 ohm), one group of the cells record test results for which the ODT impedance value of the DRAM-side varies from the highest to the lowest (for example, from a disabling of ODT to a setting of RZQ/7). Or, when the ODT of the DRAM-side is fixed to a specific impedance value (e.g. RZQ/1), one group of the cells record test results for which the impedance value of the driver variable resistance of the ASIC-side varies from the highest to the lowest (for example, from 480 ohm to 30 ohm). Since only 8 stages can be tuned in for the ODT of DDR4 DRAM, values of cells 0 h to 7 h associated with each impedance value of the driver variable resistance of the ASIC-side (i.e. each row) are initialized to "0x00", and values of cells 8 h to Fh associated with that are initialized to "0x05" (hereinafter refer to as omissions) to tell the engineer or application that these test results can be ignored.

Takes DDR4 DRAM as examples: Refer to FIG. 6. To make the interpretation easier by an engineer or application, the read-training data table may be formatted by 16×16 bytes and each byte records test result when the driver variable resistance of the DRAM-side is set to a first impedance value and the ODT of the ASIC-side is set to a second impedance value. Cells of the data table may be conceptually segmented into groups of 16 bytes. For example, when the driver variable resistance of the DRAM-side is fixed to a specific impedance value (e.g. RZQ/5), one group of the cells record test results for which the ODT impedance value of the ASIC-side varies from the highest to the lowest (for example, from 120 ohm to 40 ohm). Or, when the ODT of the ASIC-side is fixed to a specific impedance value (e.g. 120 ohm), one group of the cells record test results for which the impedance value of the driver variable resistance of the DRAM-side varies from the highest to the lowest (for example, from RZQ/5 to RZQ/7). Since only 2 stages can be tuned in for the driver of DDR4 DRAM, values of cells 0 h to 1 h associated with each impedance value of the ODT of the ASIC-side (i.e. each row) are initialized to "0x00", and values of cells 2 h to Fh associated with that are initialized to "0x05". Those artisans may modify all the omissions with an arbitrary value ranging from "0x05" to "0xFF" and the invention should not limited thereto.

Figure 9:
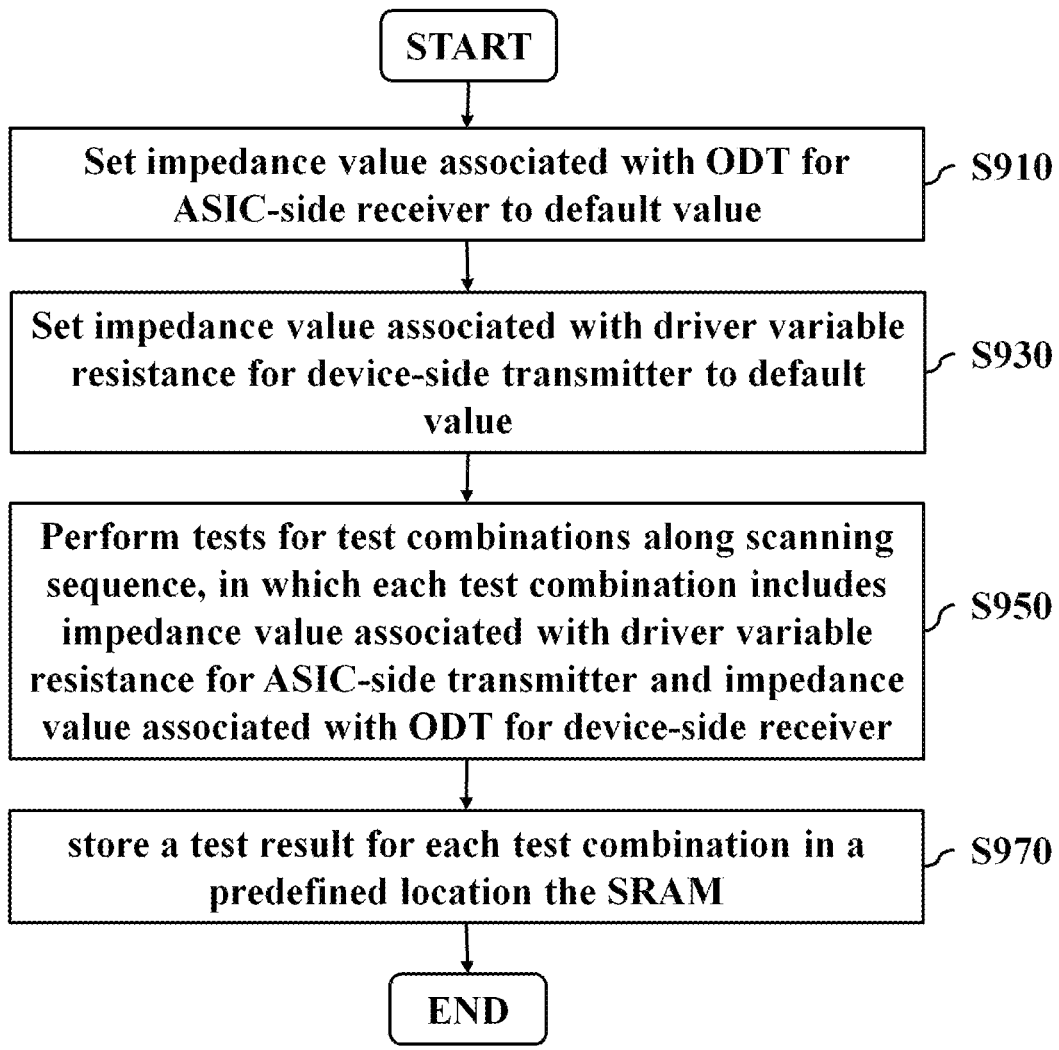
FIG. 9 is a flowchart illustrating a method for write trainings according to an embodiment of the invention.

In some embodiments, detailed techniques recited in step S430 may refer to the process flow of FIG. 9. The processing unit 210 when loading and executing program codes of a software or firmware module performs the method including steps: setting an impedance value associated with the ODT for the ASIC-side receiver to a default value (step S910); setting an impedance value associated with the driver variable resistance for the device-side transmitter to a default value (step S930); performing tests for multiple test combinations along a scanning sequence, in which each test combination includes an impedance value associated with the driver variable resistance for the ASIC-side transmitter and an impedance value associated with the ODT for the device-side receiver (step S950); and storing a test result for each test combination in a predefined location of the SRAM 230, thereby enabling the calibration host 110 to obtain the test result for each test combination from the SRAM 230 through the calibration interface 250 (step S970). Details for the scanning sequence, the test combinations, the test procedures and the test results may refer to the following passages.

Figure 7:
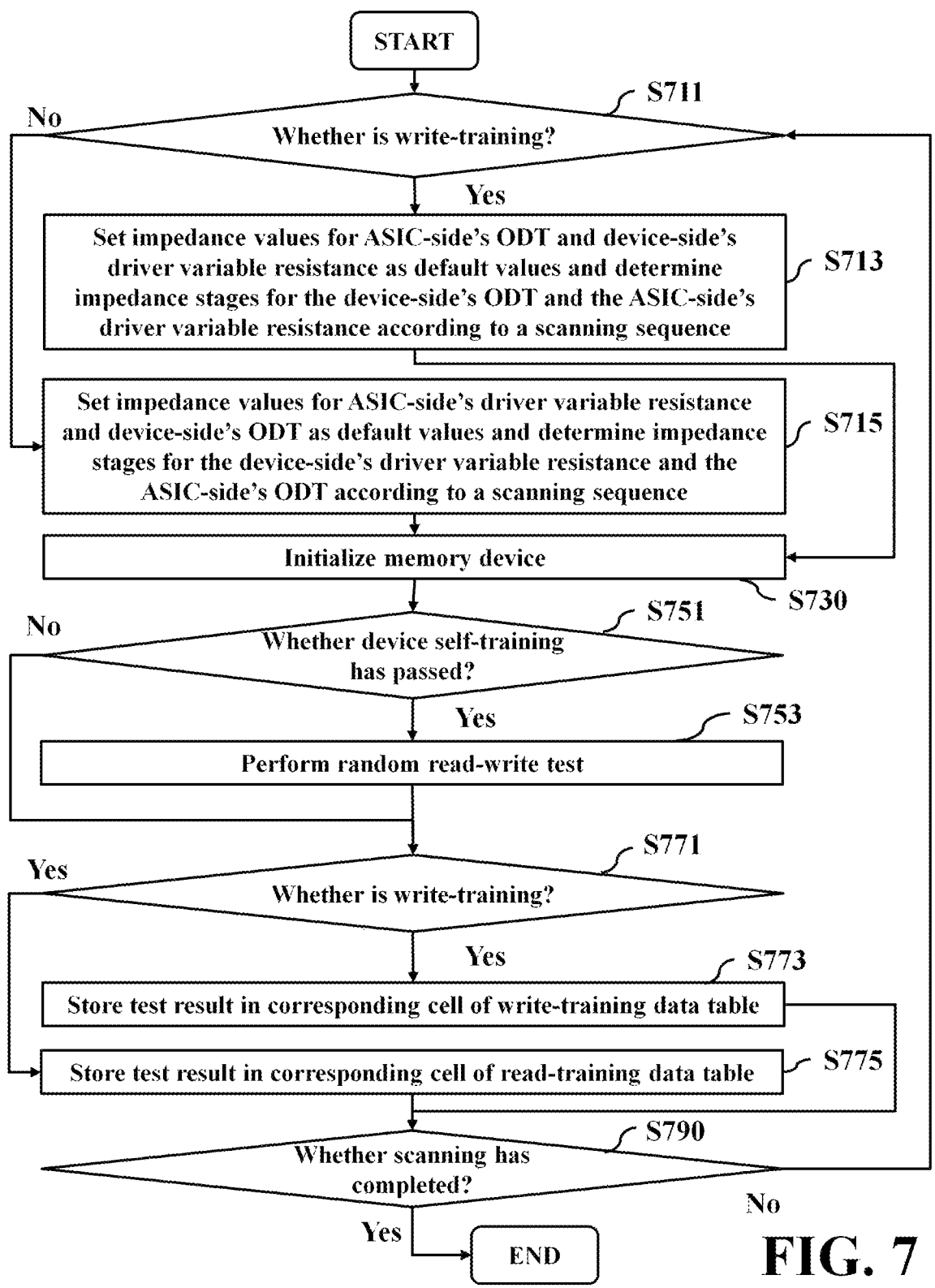
FIG. 7 is a flowchart illustrating a method for write-and-read trainings according to embodiments of the invention.

In alternative embodiments, detailed training techniques recited in steps S430 and S450 may refer to the process flow of FIG. 7. Regardless whether memory write- or read-trainings are performed, the whole process repeatedly performs a loop (steps S711 to S790) until all relevant impedance-stages for the ASIC-side and the device-side have been tested (in other words, scanned) (the "Yes" path of step S790). Execution details of the write- and read-trainings are described, respectively, as follows:

When determining that is a write training (the "Yes" path of step S711), the processing unit 210 may set the impedance values for the ASIC-side's ODT and the device-side's driver variable resistance as default values and determine impedance stages for the device-side's ODT and the ASIC-side's driver variable resistance with reference made to a scanning sequence (step S713). Taking DDR4 DRAM as an example, the default value for the ASIC-side's ODT may be 60 ohm of Table 2 and the default value for the device-side's driver variable resistance may be RZQ/5 of Table 5. As to the scanning sequence, taking examples illustrated in FIG. 5, the processing unit 210 may fix the impedance value for the device-side's ODT at the first stage, and then, stepwise vary the impedance value for the ASIC-side's driver variable resistance from 480 ohm to 30 ohm for testing. After all impedance stages for the ASIC-side's driver variable resistance have been undergone, the processing unit 210 may fix the impedance value for the device-side's ODT at the next stage and continue the stepwise variations for tests. The above operations are repeated until all combination candidates have been tested. Subsequently, a memory device is initialized (step S730). Taking DDR4 DRAM as an example, in step S730, the processing unit 410 may modify the value of the ODT-stage register 273 with the default stage set in step S713, and modify the value of the driving-stage register 275 with the stage that is determined in step S713 according to the scanning sequence. Additionally, the processing unit 410 may instruct the MAC layer 277 to issue the I/O configuration command with the setting values through the PHY 271 to the memory device 170 for setting the impedance value of the driver variable resistance of the memory device 170 to the default stage set in step S713, and the impedance value of the ODT of the memory device 170 to the stage that is determined in step S713 according to the scanning sequence. The memory device 170 may allocate small storage space as a test area. In step S730, the memory device 170 may perform a test-write-then-read on the test area, also referred to as a device self-training. The memory device 170 may send a message to the processing unit 210 through the memory interface 270 to indicate whether the device self-training has passed. When the device self-training has failed (the "No" path of step S751), the processing unit 210 may store "0x01" in a corresponding cell of the write-training data table as a test result (step S773).

To improve the test reliability, when the device self-training has passed (the "Yes" path of step S751), the processing unit 210 may further perform a random read-write test (step S753). In the random read-write test, the processing unit 210 may instruct the MAC 277 to program 8 MB data of random data pattern into the memory device 170, instruct the MAC 277 to read back from the memory device 170 and inspect whether the read-back data is consistent with the previously programmed one. The processing unit 210 may store a test result in a corresponding cell of the write-training data table according to the execution outcome of the random read-write test (step S773). Specifically, the processing unit 210 may store "0x02" in the corresponding cell of the write-training data table in response to a read timeout. When the read-back data is different from the previously programmed one, the processing unit 210 may store "0x03" in the corresponding cell of the write-training data table. The processing unit 210 may store "0x04" in the corresponding cell of the write-training data table in response to a write timeout. When the read-back data is consistence with the previously programmed one, the processing unit 210 may store "0x00" in the corresponding cell of the write-training data table. In alternative embodiments, since the corresponding cell thereof is initialized as "0x00", the processing unit 210 does not store any in the write-training data table.

When determining that is a read training (the "No" path of step S711), the processing unit 210 may set the impedance values for the ASIC-side's driver variable resistance and the device-side's ODT as default values and determine impedance stages for the device-side's ODT and the ASIC-side's driver variable resistance with reference made to a scanning sequence (step S715). Taking DDR4 DRAM as an example, the default value for the ASIC-side's driver variable resistance may be 60 ohm of Table 1 and the default value for the device-side's ODT may be RZQ/4 of Table 6. As to the scanning sequence, taking examples illustrated in FIG. 6, the processing unit 210 may fix the impedance value for the device-side's driver variable resistance at the first stage, and then, stepwise vary the impedance value for the ASIC-side's ODT from 120 ohm to 40 ohm for testing. After all impedance stages for the ASIC-side's ODT have been undergone, the processing unit 210 may fix the impedance value for the device-side's driver variable resistance at the next stage and continue the stepwise variations for tests. The above operations are repeated until all combination candidates have been tested. Subsequently, a memory device is initialized (step S730). Detailed techniques of step S730 may refer to the descriptions of the above passages, and are omitted for brevity. When the device self-training has failed (the "No" path of step S751), the processing unit 210 may store "0x01" in a corresponding cell of the read-training data table as a test result (step S773). When the device self-training has been passed (the "Yes" path of step S751), the processing unit 210 may further perform a random read-write test (step S753). Detailed techniques of step S753 may refer to the descriptions of the above passages, and are omitted for brevity. The processing unit 210 may store a test result in a corresponding cell of the read-training data table according to the execution outcome of the random read-write test (step S775). Specifically, the processing unit 210 may store "0x02" in the corresponding cell of the read-training data table in response to a read timeout. When the read-back data is different from the previously programmed one, the processing unit 210 may store "0x03" in the corresponding cell of the read-training data table. The processing unit 210 may store "0x04" in the corresponding cell of the read-training data table in response to a write timeout. When the read-back data is consistence with the previously programmed one, the processing unit 210 may store "0x00" in the corresponding cell of the read-training data table. In alternative embodiments, since the corresponding cell thereof is initialized as "0x00", the processing unit 210 does not store any in the read-training data table.

It may benefit an engineer or application executed by the processing unit 115 to diagnose the impedance matching problems resulted from specific settings of the memory interface when more error-types can be recorded in cells of the data tables.

Figure 8:
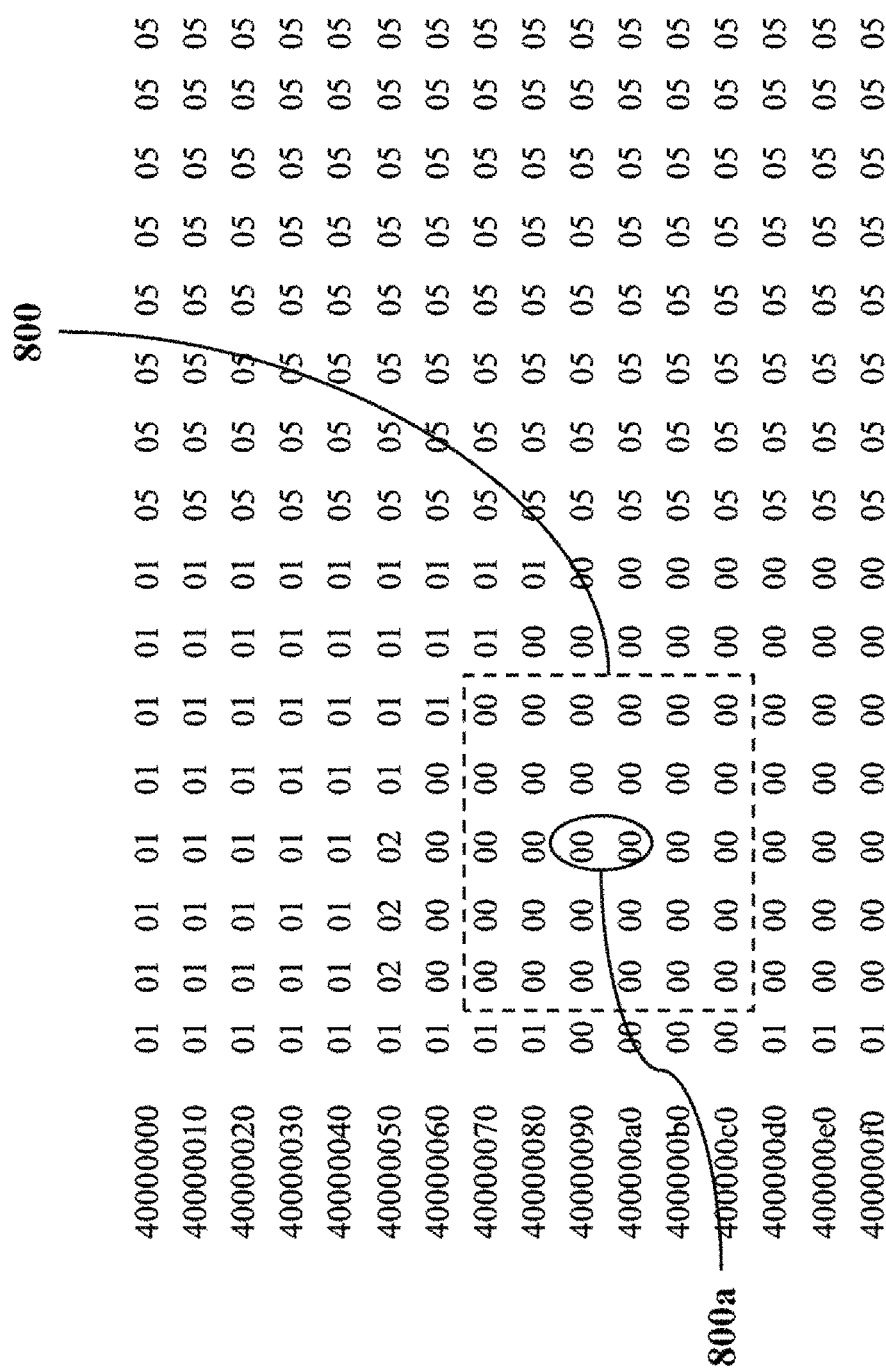
FIG. 8 illustrates exemplary results of write trainings of DDR4 DRAM according to an embodiment of the invention.

In step S470, the processing unit 115 of the calibration host 110 may drive the DMA controller 290 through the calibration interface 250 to read the content of a preset region of the SRAM 230 as basis for configuring the transmitters and the receivers of the memory interface. Refer to the exemplary results as shown in FIG. 8. It may be observed by an engineer or the processing unit 115 when executing an application that the memory interface 270 works fine when the impedance value of the ASIC-side's driver variable resistance falls within a range from 60 ohm to 36.9 ohm and the impedance value of the device-side's ODT falls within a range from RZQ/1 to RZQ/5 (as shown in the dashed box 800). The engineer or the processing unit 115 when executing the application may program the impedance stages of the ASIC-side's driver variable resistance and ODT and the device-side's driver variable resistance and ODT that are associated with one central value 800a of the normal region 800 into non-volatile storage space of the controller 150 as factory settings.

Some or all of the aforementioned embodiments of the method of the invention may be implemented in a computer program such as an operating system for a computer, a driver for a dedicated hardware of a computer, or a software application program. Other types of programs may also be suitable, as previously explained. Since the implementation of the various embodiments of the present invention into a computer program can be achieved by the skilled person using his routine skills, such an implementation will not be discussed for reasons of brevity. The computer program implementing some or more embodiments of the method of the present invention may be stored on a suitable computer-readable data carrier such as a DVD, CD-ROM, USB stick, a hard disk, which may be located in a network server accessible via a network such as the Internet, or any other suitable carrier.

The computer program may be advantageously stored on computation equipment, such as a computer, a notebook computer, a tablet PC, a mobile phone, a digital camera, a consumer electronic equipment, or others, such that the user of the computation equipment benefits from the aforementioned embodiments of methods implemented by the computer program when running on the computation equipment. Such the computation equipment may be connected to peripheral devices for registering user actions such as a computer mouse, a keyboard, a touch-sensitive screen or pad and so on.

Although the embodiment has been described as having specific elements in FIG. 2, it should be noted that additional elements may be included to achieve better performance without departing from the spirit of the invention. Each element of FIG. 2 is composed of various circuits and arranged to operably perform the aforementioned operations. While the process flows described in FIGS. 4, 7 and 9 include a number of operations that appear to occur in a specific order, it should be apparent that these processes can include more or fewer operations, which can be executed serially or in parallel (e.g., using parallel processors or a multi-threading environment).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for configuring impedance of memory interfaces, performed by a processing unit when loading and executing program codes of a software or firmware module, wherein the processing unit is coupled to a memory interface, a static random access memory (SRAM) and a calibration interface, the memory interface is coupled to a memory device and comprises a first transmitter and a first receiver, and the memory device comprises a second transmitter and a second receiver, the method comprising:

setting a first impedance value associated with an on-die termination (ODT) for the first receiver to a first default value for a first training process, wherein the first receiver of the memory interface of a controller receives signals from the second transmitter of the memory device;

setting a second impedance value associated with a driver variable resistance for the second transmitter to a second default value for the first training process;

performing tests for a plurality of first test combinations for the first training process, in which each first test combination comprises a third impedance value associated with a driver variable resistance for the first transmitter and a fourth impedance value associated with an ODT for the second receiver, wherein the first transmitter of the memory interface of the controller sends signals to the second receiver of the memory device; and storing a test result for each first test combination in a predefined location of the SRAM, thereby enabling a calibration host to obtain the test result for each first test combination from the SRAM through the calibration interface, wherein the first training process comprises a plurality of iterations, and each iteration corresponding to one first test combination comprises:

varying the driver variable resistance for the first transmitter according to the corresponding third impedance value:

varying the our for the second receiver according to the corresponding fourth impedance value; and performing the tests when the ODT for the first receiver is fixed to the first default value, and the driver variable resistance for the second transmitter is fixed to the second default value.

2. The method of claim 1, comprising:

receiving a command with impedance settings from the calibration host, wherein the impedance settings are determined by the calibration host according to the test results for the first test combinations; and programming the impedance settings into non-volatile storage space of the controller and the memory device as factory settings, wherein the controller comprises the processing unit.

3. The method of claim 1, wherein the test results for the first test combinations are stored in a data, table, comprising, a first axis and a second axis, the first axis is associated with, signal strengths related to, the ODT of the memory device sorted from the strongest to the weakest or from the weakest to the strongest, and the second axis is associated with signal strengths related to a driver of the memory interface sorted from the strongest to the weakest or from the weakest to the strongest.

4. The method of claim 3, wherein the data table comprises a plurality of bytes and each byte records a test result when a driver variable resistance of the memory interface is set to a fifth impedance value and an ODT of the memory device set to a sixth impedance value.

5. The method of claim 4, wherein ach byte being a first value represents that a test-write-then-read on a test area of storage space of the memory device has failed.

6. The method of claim 4, wherein each byte being a second value represents that a read timeout happens when the processing instructs the memory interface to perform a random read-write test, each byte being a third value represents that a write timeout happens when the processing unit instructs the memory interface to perform a random read-write test, and each byte being a fourth value represents that read-back data is different from previously programmed data whet the processing unit instructs the memory interface to perform a random read-write test.

7. The method of claim 1, comprising:

setting a fifth impedance value associated with the ODT for the second receiver to a third default value for a second training process, where in the second receiver receives signals from the first transmitter of the memory interface of the controller;

setting a sixth impedance value associated driver variable stance for the first transmitter to a fourth default value for the second training process;

performing tests for a plurality of second test combinations for the second training process, in which each second test combination comprises a seventh impedance value associated with the driver variable resistance for the second transmitter and an eighth impedance value associated with the ODT for the first receiver, wherein the second transmitter of the memory d sends signals to the first receiver of the memory interface of the controller; and storing a test result for each second test combination in a predefined location the SRAM, thereby enabling the calibration host to obtain the test result for each second test combination from the SRAM through the calibration interface.

8. The method of claim 7, comprising:

receiving a command with impedance settings from the calibration host, wherein the impedance settings are determined by the calibration host according to the test results for the first and second test combinations; and programming the impedance settings into non-volatile storage space of the controller and the memory device as factor settings, wherein the controller comprises the processing unit.

9. A non-transitory computer program product for configuring impedance of memory interfaces when executed by a processing unit, wherein the processing unit is coupled to a memory interface, a static random access memory (SRAM) and a calibration interface, the memory interface is coupled to a memory device and comprises a first transmitter and a first receiver, and the memory device comprises a second transmitter and a second receiver, the non-transitory computer program product comprising program code to:

set a first impedance value associated with an on-die termination (ODT) for the first receiver to a first default value for a first training process, wherein the first receiver of the memory interface of a controller receives signals from the second transmitter of the memory device;

set a second, impedance value associated with a dr variable resistance for the second transmitter to a second default value for the first training process;

perform tests for a plurality of first test combinations for the first training process, in which each first test combination comprises a third impedance value associated with a driver variable resistance for the first transmitter and a fourth impedance value associated with an ODT for second receiver, wherein the first transmitter of the memory interface of the controller sends signals to the second receiver of the memory device; and store a test result for each first test combination in a predefined location of the SRAM, thereby enabling a calibration host to obtain the test result for each first test combination from the SRAM through the calibration interface, wherein the first training process comprises a plurality of iterations, and each, iteration corresponding to one first test combination comprises:

varying the driver variable resistance for the first transmitter according to the corresponding third impedance value;

varying the ODT for the second receiver according to the corresponding fourth impedance value; and performing tests when the ODT for the first receiver is fixed to the first default value, and, the driver variable resistance for the second transmitter is fixed to the second default value.

10. The non-transitory computer program product of claim 9, comprising program code to:

receive a command with impedance settings from the calibration host, wherein the impedance settings are determined by the calibration host according to the test result for the first test combinations; and program the impedance settings into non-volatile storage space of the controller and the memory device as factory settings, wherein the controller comprises the processing unit.

11. The non-transitory computer program product of claim 9, wherein the test results for the first test combinations are stored in a data, table comprising a first axis and a second axis, the first axis is associated signal strengths related to the ODT of the memory device sorted from the strongest to the weakest or from the weakest to the strongest, and the second axis is associated with signal strengths related to a driver of the memory interface sorted from the strongest to the weakest or from the weakest to the strongest.

12. The non-transitory computer program product of claim 11, wherein the data table comprises a plurality of bytes and each byte records a test result when a driver variable resistance of the memory interface is set to a fifth impedance value and an ODT of the memory device is set to a sixth impedance value.

13. The non-transitory computer program product of claim 12, wherein each byte being a first value represents that a test-write-then-read on a test area of storage space of the memory device has failed.

14. The non-transitory computer program product of claim 12, wherein each byte being a second value represents that a read timeout happens when the processing unit instructs the memory interface to perform a random read-write test, each byte being a third value represents that a write timeout happens when the processing unit instructs the memory interface to perform a random read-write test, and each byte being a fourth value represents that read-back data is different from previously programmed data when the processing unit instructs the memory interface to perform a random read-write test.

15. An apparatus for configuring impedance of memory interfaces, comprising:
 a controller, comprising:
  a memory interface, coupled to a memory device, comprising a first transmitter and a first receiver; and
  a calibration interface, coupled to a host;
  a static random access memory (SRAM); and
 a processing unit, coupled to the memory interface, the calibration interface and the SRAM, arranged to operably set a first impedance value associated with an on-die termination (ODT) for the first receiver to a first default value for a first training process, wherein the first receiver receives signals from a second transmitter of the memory device; set a second impedance value associated with a driver variable resistance for the second transmitter to a second default value for the first training process; perform tests for a plurality of first test combinations for the first training process, in which each first test combination comprises a third impedance value associated with a driver variable resistance for the first transmitter and a fourth impedance value associated with an ODT for the second receiver, wherein the first transmitter sends signals to a second receiver of the memory device; and store a test result for each first test combination in a predefined location of the SRAM, thereby enabling a calibration host to obtain the test result for each first test combination from the SRAM through the calibration interface,
 wherein the first training process comprises a plurality of iterations, and each iteration corresponding to one first test combination comprises:
 varying the driver variable resistance for the first transmitter according to the corresponding third impedance value;
 varying the ODT for the second receiver according to the corresponding fourth impedance value; and
 performing the tests when the ODT for the first receiver is fixed to the first default value, and the driver variable resistance for the second transmitter is fixed to the second default value.

16. The apparatus of claim 15, comprising:
 the host, arranged to operably determine impedance settings according to the test results for the first test combinations and issue a command with the impedance settings to the controller through the calibration interface,
 wherein the processing unit arranged to operably program the impedance settings into non-volatile storage space of the controller and the memory device as factory settings.

17. The apparatus of claim 15, wherein the test results for the first test combinations are stored in a data table comprising a first axis and a second axis, the first axis is associated with signal strengths related to the ODT of the memory device sorted from the strongest to the weakest or from the weakest to the strongest, and the second axis is associated with signal strengths related to a driver of the memory interface sorted from the strongest to the weakest or from the weakest to the strongest.

18. The apparatus f claim 17, wherein the data table comprises a plurality of bytes and each byte records a test when a driver variable resistance of the memory interface is set to a fifth impedance value and an ODT of the memory device is set to a sixth impedance value.

19. The apparatus of claim 18, wherein each byte being a first value represents that a test-write-then-read on a test area of storage space of the memory device has failed.

20. The apparatus of claim 18, wherein each byte being a second value represents that a read timeout happens when the processing unit is arranged operably to instruct the memory interface to perform a random read-write test, each byte being a third value represents that a write timeout happens when the processing unit is arranged, operably to instruct the memory interface to perform a random read-write test, and each byte being a fourth value represents that read-back data is different from previously programmed data when the processing unit is arranged operably to instruct the memory interface to perform a random read-write test.

* * * * *